US012588490B2

(12) United States Patent
Zhou et al.

(10) Patent No.: US 12,588,490 B2
(45) Date of Patent: Mar. 24, 2026

(54) SEMICONDUCTOR STRUCTURE COMPRISING POWER DELIVER NETWORK STRUCTURE

(71) Applicant: United Microelectronics Corp., Hsinchu (TW)

(72) Inventors: Zhi-Biao Zhou, Singapore (SG); Ding Lung Chen, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 378 days.

(21) Appl. No.: 18/317,117

(22) Filed: May 15, 2023

(65) Prior Publication Data

US 2024/0347459 A1    Oct. 17, 2024

(30) Foreign Application Priority Data

Apr. 17, 2023    (CN) .......................... 202310406324.4

(51) Int. Cl.
*H01L 23/528*        (2006.01)
(52) U.S. Cl.
CPC .............................. *H01L 23/5286* (2013.01)
(58) Field of Classification Search
CPC ......................... H01L 23/5286; H01L 23/5386
See application file for complete search history.

(56) References Cited

U.S. PATENT DOCUMENTS 9,023,688 B1    5/2015  Or-Bach et al.
2012/0292777 A1*  11/2012  Lotz ................... H01L 23/5286
                                              438/459
2017/0294448 A1*  10/2017  Debacker ............ H01L 23/5286
2021/0118798 A1*  4/2021  Liebmann ......... H01L 21/76895
2021/0143127 A1*  5/2021  Jain ....................... H01L 23/481
2022/0254769 A1*  8/2022  Sio ..................... H10D 84/0186
2022/0375920 A1*  11/2022  Xian ...................... H10D 84/85

OTHER PUBLICATIONS

"Search Report and Written Opinion of Singapore Counterpart Application", issued on Apr. 11, 2025, p. 1-p. 11.

* cited by examiner

*Primary Examiner* — Evan G Clinton
*Assistant Examiner* — Corbyn D Mellinger
(74) *Attorney, Agent, or Firm* — JCIPRNET

(57)        ABSTRACT

Provided is a semiconductor including a substrate, a semiconductor element disposed on the substrate, an interconnect structure, first and second power deliver lines, and first and second power deliver network (PDN) structures. The interconnect structure is disposed in the element region, above the semiconductor element, and electrically connected with the semiconductor element. The first and the second power deliver lines are disposed above the interconnect structure and electrically connected to the first and the second power supplies, respectively. The first PDN structure is disposed between the substrate and the first power deliver line, and connected to the first power deliver line and a lowest circuit layer of the interconnect structure. The second PDN structure is disposed between the substrate and the second power deliver line, and connected to the second power deliver line and the lowest circuit layer of the interconnect structure.

16 Claims, 8 Drawing Sheets

SEMICONDUCTOR STRUCTURE COMPRISING POWER DELIVER NETWORK STRUCTURE

CROSS-REFERENCE TO RELATED APPLICATION

This application claims the priority benefit of China application serial no. 202310406324.4, filed on Apr. 17, 2023. The entirety of the above-mentioned patent application is hereby incorporated by reference herein and made a part of this specification.

BACKGROUND

Technical Field

The disclosure relates to a semiconductor structure, and in particular relates to a semiconductor structure capable of providing power almost without loss and uniformly to the lowest circuit layer of an interconnect structure in an element region through a power deliver network (PDN) structure.

Description of Related Art

In current semiconductor devices, a power deliver network may be used to transmit voltage from a power source to semiconductor elements (e.g., transistors). Generally, the circuit deliver network includes a metal wire disposed between a redistribution layer (RDL) and a semiconductor element. However, this power deliver method often causes power loss (or referred to as IR drop) and uneven power supply. As a result, performance and power efficiency of the semiconductor device are adversely affected.

SUMMARY

A semiconductor structure is provided in the disclosure. A power deliver network structure is disposed between a power deliver line and a substrate, and is connected to the power deliver line and a lowest circuit layer of an interconnect structure.

A semiconductor structure of the disclosure includes a substrate, a semiconductor element, an interconnect structure, a first power deliver line, a second power deliver line, a first power deliver network structure, and a second power deliver network structure. The substrate includes an element region and a peripheral region surrounding the element region. The semiconductor element is disposed on the substrate in the element region. The interconnect structure is disposed in the element region, located above the semiconductor element, and electrically connected to the semiconductor element. The first power deliver line is disposed above the interconnect structure and is electrically connected to a first power source. The second power deliver line is disposed above the interconnect structure and is electrically connected to a second power source. The first power deliver network structure is disposed between the substrate in the peripheral region and the first power deliver line, and is connected to the first power deliver line and a lowest circuit layer of the interconnect structure. The second power deliver network structure is disposed between the substrate in the peripheral region and the second power deliver line, and is connected to the second power deliver line and the lowest circuit layer of the interconnect structure.

In an embodiment of the semiconductor structure of the disclosure, the first power deliver network structure includes multiple first power deliver circuit layers and multiple first power deliver vias. The first power deliver vias are connected to two adjacent first power deliver circuit layers among the first power deliver circuit layers. The lowest first power deliver circuit layer of the first power deliver circuit layers is connected to the lowest circuit layer of the interconnect structure, and the rest of the first power deliver circuit layers are spaced apart from the interconnect structure by a first distance.

In an embodiment of the semiconductor structure of the disclosure, the first distance is between 1 μm and 10 μm.

In an embodiment of the semiconductor structure of the disclosure, a first dummy structure is further included. The first dummy structure is disposed between the first power deliver network structure and the interconnect structure, and is electrically separated from the first power deliver network structure and the interconnect structure.

In an embodiment of the semiconductor structure of the disclosure, the first dummy structure includes multiple first dummy circuit layers.

In an embodiment of the semiconductor structure of the disclosure, each of the first dummy circuit layers is located at a same horizontal height as the corresponding first power deliver circuit layer.

In an embodiment of the semiconductor structure of the disclosure, a material of the first dummy structure is the same as a material of the first power deliver network structure.

In an embodiment of the semiconductor structure of the disclosure, the first power deliver network structure is located in the peripheral region.

In an embodiment of the semiconductor structure of the disclosure, the first power deliver network structure is located in the interconnect structure.

In an embodiment of the semiconductor structure of the disclosure, a first support structure is further included. The first support structure is disposed between the first power deliver network structure and the substrate.

In an embodiment of the semiconductor structure of the disclosure, the second power deliver network structure includes multiple second power deliver circuit layers and multiple second power deliver vias. The second power deliver vias are connected to two adjacent power deliver circuit layers among the second power deliver circuit layers. The lowest second power deliver circuit layer of the second power deliver circuit layers is connected to the lowest circuit layer of the interconnect structure, and the rest of the second power deliver circuit layers are spaced apart from the interconnect structure by a second distance.

In an embodiment of the semiconductor structure of the disclosure, the second distance is between 1 μm and 10 μm.

In an embodiment of the semiconductor structure of the disclosure, a second dummy structure is further included. The second dummy structure is disposed between the second power deliver network structure and the interconnect structure, and is electrically separated from the second power deliver network structure and the interconnect structure.

In an embodiment of the semiconductor structure of the disclosure, the second dummy structure includes multiple second dummy circuit layers.

In an embodiment of the semiconductor structure of the disclosure, each of the second dummy circuit layers is located at a same horizontal height as the corresponding second power deliver circuit layer.

In an embodiment of the semiconductor structure of the disclosure, a material of the second dummy structure is the same as a material of the second power deliver network structure.

In an embodiment of the semiconductor structure of the disclosure, the second power deliver network structure is located in the peripheral region.

In an embodiment of the semiconductor structure of the disclosure, the second power deliver network structure is located in the interconnect structure.

In an embodiment of the semiconductor structure of the disclosure, a second support structure is further included. The second support structure is disposed between the second power deliver network structure and the substrate.

In an embodiment of the semiconductor structure of the disclosure, a distance between the first power deliver network structure and the second power deliver network structure is between 10 μm and 1000 μm.

To sum up, in this disclosure, a power deliver network structure is disposed between a power deliver line and a substrate, and is connected to the power deliver line and a lowest circuit layer of an interconnect structure. In this way, it may be ensured that the power from the power source may be directly delivered from the power deliver line down to the lowest circuit layer of the interconnect structure, so that the power may be delivered to the semiconductor element almost without loss and uniformly.

In order to make the above-mentioned features and advantages of the disclosure comprehensible, embodiments accompanied with drawings are described in detail below.

BRIEF DESCRIPTION OF THE DRAWINGS

FIG. 1B is a top schematic diagram of the semiconductor structure of the first embodiment, in which FIG. 1A is drawn along section line I-I' in FIG. 1B.

FIG. 2B is a top schematic diagram of the semiconductor structure of the second embodiment, in which FIG. 2A is drawn along section line II-II' in FIG. 2B.

FIG. 3B is a top schematic diagram of the semiconductor structure of the third embodiment, in which FIG. 3A is drawn along section line III-III' in FIG. 3B.

DETAILED DESCRIPTION OF DISCLOSED EMBODIMENTS

The following examples are described in detail with the accompanying drawings, but the provided examples are not intended to limit the scope of the disclosure. In addition, the drawings are for illustrative purposes only and are not drawn in full scale. In order to facilitate understanding, the same elements in the following description are described with the same symbols.

The terms such as "including", "comprising", "having", etc. used in the text are all open-ended terms, that is, "including but not limited to".

When terms such as "first" and "second" are used to describe elements, they are only used to distinguish these elements from each other, and do not limit the order or importance of these elements. Therefore, in some cases, a first element may also be referred to as a second element, and a second element may also be referred to as a first element, without departing from the scope of the disclosure.

Furthermore, wordings used to indicate directions in the disclosure, such as "up," "down," "front," "back," "left," and "right," merely refer to directions in the accompanying drawings, and are not used to limit the disclosure. Thus, it should be understood that "on" may be used interchangeably with "under" and that when an element such as a layer or film is placed "on" another element, the element may be placed directly on the other element, or there may be an intermediate element. On the other hand, when an element is referred to be placed "directly on" another element, there are no intermediate elements present between the two.

In addition, herein, the range indicated by "one numerical value to another numerical value" is a general representation which avoids enumerating all numerical values in the stated range one by one in the specification. Thus, the recitation of a particular numerical range encompasses any numerical value within that numerical range, as well as smaller numerical ranges bounded by any numerical value within that numerical range.

In a semiconductor structure of the disclosure, a power deliver line is connected to a power supply and a power deliver network structure, so that the power provided by the power supply may be delivered to the semiconductor element almost without loss and uniformly. The semiconductor structure of the disclosure is described in detail below.

Figure 1A:
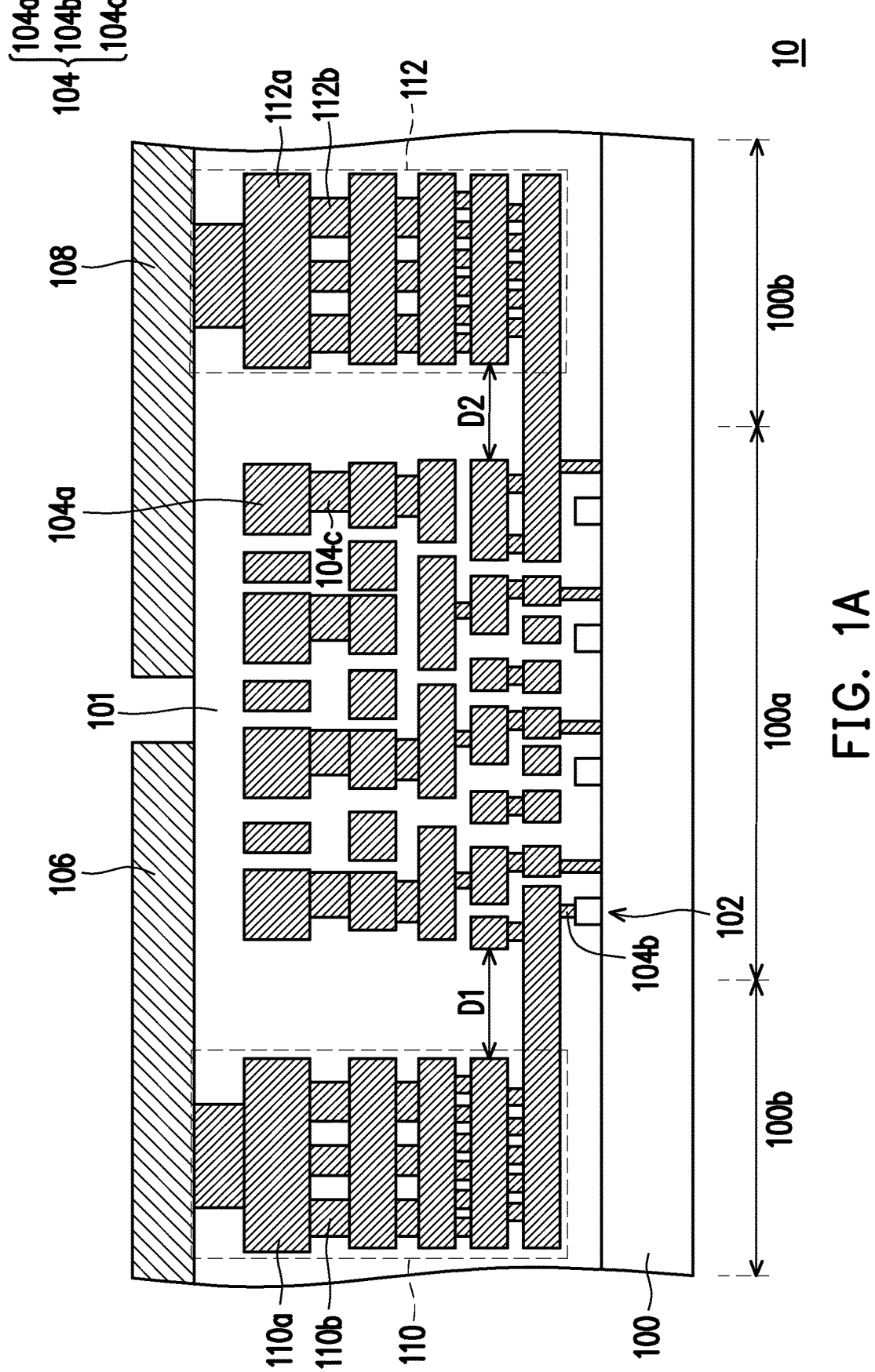
FIG. 1A is a cross-sectional schematic diagram of a semiconductor structure of a first embodiment of the disclosure.
Figure 1B:
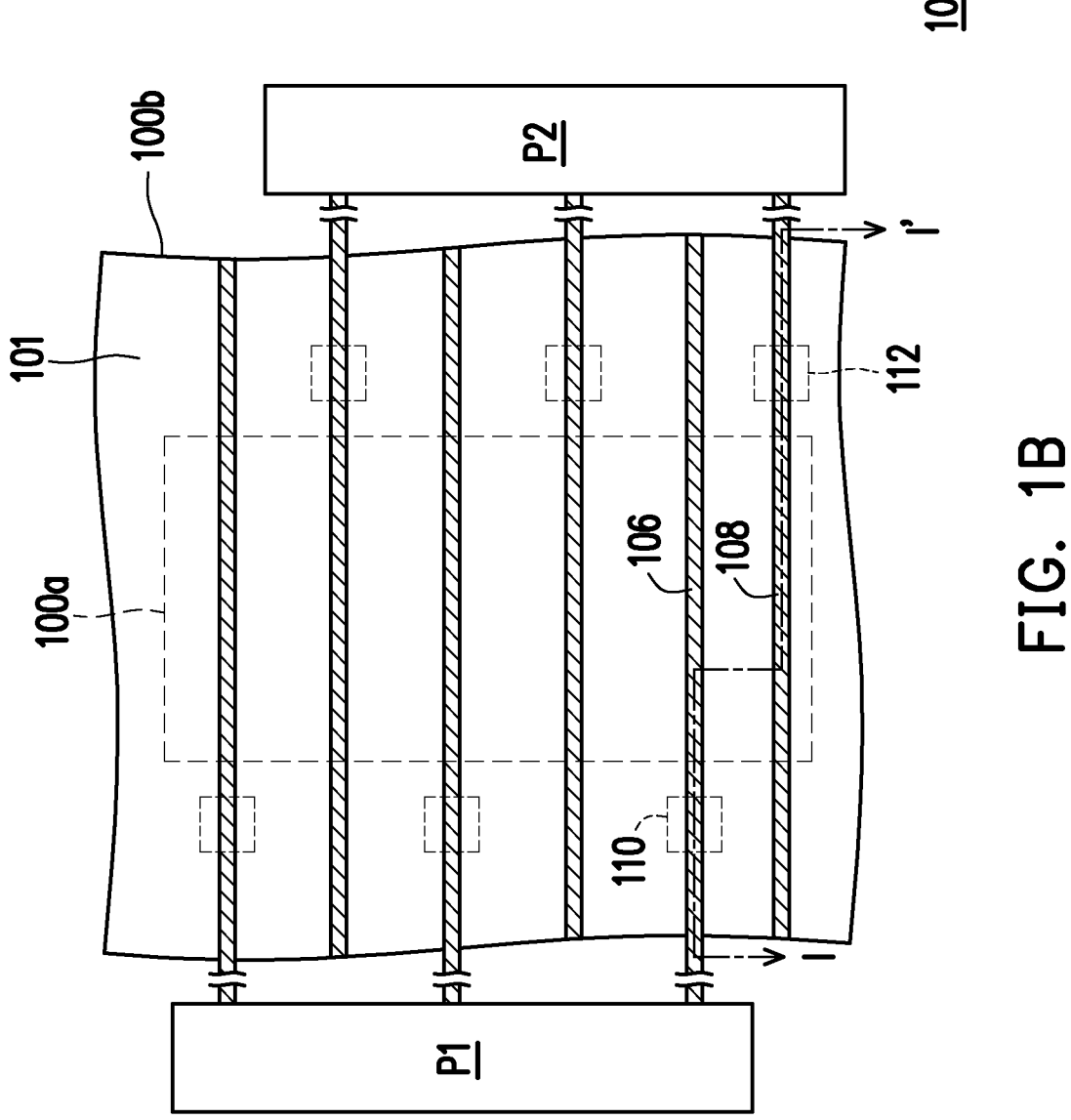

FIG. 1A is a cross-sectional schematic diagram of a semiconductor structure of a first embodiment of the disclosure. FIG. 1B is a top schematic diagram of the semiconductor structure of the first embodiment, in which FIG. 1A is drawn along section line I-I' in FIG. 1B.

Referring to FIG. 1A and FIG. 1B at the same time, a semiconductor structure 10 of the disclosure includes a substrate 100, a semiconductor element 102, an interconnect structure 104, a first power deliver line 106, a second power deliver line 108, a first power deliver network structure 110, and a second power deliver network structure 112. In addition, the semiconductor structure 10 further includes a dielectric layer 101 disposed on the substrate 100, and the dielectric layer 101 covers the semiconductor element 102, the interconnect structure 104, the first power deliver network structure 110, and the second power deliver network structure 112. In other words, the semiconductor element 102, the interconnect structure 104, the first power deliver network structure 110 and the second power deliver network structure 112 are disposed in the dielectric layer 101, and the first power deliver line 106 and the second power deliver line 108 are disposed on the dielectric layer 101.

In this embodiment, the substrate 100 may be a silicon substrate or a silicon on insulator (SOI) substrate. The substrate 100 includes an element region 100a and a peripheral region 100b surrounding the element region 100a. The semiconductor element 102 is disposed on the substrate 100 in the element region 100a. The semiconductor element 102 may be a logic element, an analog element, or a memory element. In this embodiment, a transistor is used as an example of the semiconductor element 102, but the disclosure is not limited thereto. In addition, the detailed structure of the semiconductor element 102 is well known to those skilled in the art, so it is only schematically shown in the figure and not further described. In addition, elements other than logic elements, analog elements, and memory elements may be disposed on the substrate 100 in the peripheral region 100b. Those other elements may be dummy elements, alignment elements, conductive elements, heat dissipation elements, etc., which are not limited by the disclosure.

The interconnect structure 104 is disposed in the element region 100a and is located above the semiconductor element 102. The interconnect structure 104 is electrically connected to the semiconductor element 102. In this embodiment, the interconnect structure 104 includes multiple circuit layers 104a, multiple contacts 104b, and multiple vias 104c. The contact window 104b is configured to connect the lowest circuit layer 104a of the interconnect structure 104 with the semiconductor element 102, and the via 104c is configured to connect two adjacent circuit layers 104a. The detailed structure of the interconnect structure 104 is well known to those skilled in the art, so it is not further described.

The first power deliver line 106 and the second power deliver line 108 are disposed parallel to each other on the dielectric layer 101 and extend in the element region 100a and the peripheral region 100b. The first power deliver line 106 is electrically connected to the first power source P1, and the second power deliver line 108 is electrically connected to the first power source P2. In this way, the first power source P1 and the first power source P2 may deliver power to the semiconductor element 102 from the outside through the first power deliver line 106 and the second power deliver line 108. In this embodiment, three first power deliver lines 106 and three second power deliver lines 108 are disposed on the dielectric layer 101, but the disclosure is not limited thereto. In other embodiments, depending on actual requirements, one, two or more first power deliver lines 106 may be disposed on the dielectric layer 101, and one, two or more second power deliver lines 108 may be disposed on the dielectric layer 101. In addition, depending on actual requirements, the number of the first power deliver lines 106 and the number of the second power deliver lines 108 may be equal or different.

In addition, in this embodiment, as shown in FIG. 1B, the first power deliver line 106 and the second power deliver line 108 have a straight line pattern and are parallel to each other when viewed from the top view direction above the dielectric layer 101, but the disclosure is not limited thereto. In other embodiments, the first power deliver line 106 and the second power deliver line 108 may not have a straight pattern, as long as the first power deliver line 106 does not intersect with the second power deliver line 108.

The first power deliver network structure 110 is disposed between the substrate 100 and the first power deliver line 106, and is connected to the first power deliver line 106 and the lowest circuit layer 104a of the interconnect structure 104. In detail, in this embodiment, the first power deliver network structure 110 includes multiple first power deliver circuit layers 110a and multiple first power deliver vias 110b. The first power deliver via 110b is configured to connect two adjacent first power deliver circuit layers 110a. In addition, the uppermost first power deliver via 110b is configured to connect the first power deliver line 106 with the first power deliver circuit layer 110a of the highest layer. In addition, the lowest first power deliver circuit layer 110a is connected to the lowest circuit layer 104a of the interconnect structure 104, and the rest of the first power deliver circuit layers 110a are spaced apart from the interconnect structure 104 by a first distance D1. In this embodiment, the first distance D1 may be between 1 μm and 10 μm. The first distance D1 may ensure that the interconnect structure 104 is affected by the first power deliver circuit layer 110a when transmitting electrical signals, and that the layout area of the semiconductor structure of the disclosure is not too large.

In this embodiment, the first power deliver network structure 110 is located in the peripheral region 100a, and is spaced from the interconnect structure 104 in the element region 100a by a first distance D1. In addition, in the first power deliver network structure 110, only the lowest first power deliver circuit layer 110a is connected to the lowest circuit layer 104a of the interconnect structure 104. In this way, it may be ensured that the power from the first power source P1 may be directly delivered down to the lowest circuit layer 104a of the interconnect structure 104, and that the power may be delivered to the semiconductor element 102 almost without loss and uniformly through the lowest circuit layer 104a.

In addition, in this embodiment, the total height of the stacked first power deliver circuit layer 110a may be substantially equal to the total height of the stacked circuit layer 104a, and the number of first power deliver circuit layers 110a in the first power deliver network structure 110 may be equal to the number of circuit layers 104a in the interconnect structure 104. In other words, the first power deliver network structure 110 and the interconnect structure 104 may be formed simultaneously in one manufacturing process. Therefore, the first power deliver circuit layer 110a may be located at the same horizontal height as the corresponding circuit layer 104a, and may be formed of the same material. In this way, the complexity of the manufacturing process may be avoided.

The second power deliver network structure 112 is disposed between the substrate 100 and the second power deliver line 108, and is connected to the second power deliver line 108 and the lowest circuit layer 104a of the interconnect structure 104. In detail, in this embodiment, the second power deliver network structure 112 includes multiple second power deliver circuit layers 112a and multiple second power deliver vias 112b. The second power deliver via 112b is configured to connect two adjacent second power deliver circuit layers 112a. In addition, the uppermost second power deliver via 112b is configured to connect the second power deliver line 108 with the second power deliver circuit layer 112a of the highest layer. In addition, the lowest second power deliver circuit layer 112a is connected to the lowest circuit layer 104a of the interconnect structure 104, and the rest of the second power deliver circuit layers 112a are spaced apart from the interconnect structure 104 by a first distance D2. In this embodiment, the second distance D2 may be between 1 μm and 10 μm. The second distance D2 may ensure that the interconnect structure 104 is affected by the second power deliver circuit layer 112a when transmitting electrical signals, and that the layout area of the semiconductor structure of the disclosure is not too large. Depending on the actual situation, the second distance D2 may be the same as or different from the first distance.

In this embodiment, the second power deliver network structure 112 is located in the peripheral region 100a, and is spaced from the interconnect structure 104 in the element region 100a by a second distance D2. In addition, in the second power deliver network structure 112, only the lowest second power deliver circuit layer 112a is connected to the lowest circuit layer 104a of the interconnect structure 104. In this way, it may be ensured that the power from the second power source P2 may be directly delivered down to the lowest circuit layer 104a of the interconnect structure 104, and that the power may be delivered to the semiconductor element 102 almost without loss and uniformly through the lowest circuit layer 104a.

In addition, in this embodiment, the total height of the stacked second power deliver circuit layer 112a may be substantially equal to the total height of the stacked circuit layer 104a, and the number of second power deliver circuit layers 112a in the second power deliver network structure 112 may be equal to the number of circuit layers 104a in the interconnect structure 104. In other words, the second power deliver network structure 112 and the interconnect structure 104 may be formed simultaneously in one manufacturing process. Therefore, the second power deliver circuit layer 112a may be located at the same horizontal height as the corresponding circuit layer 104a, and may be formed of the same material. In this way, the complexity of the manufacturing process may be avoided.

That is to say, in this embodiment, the interconnect structure 104, the first power deliver network structure 110 and the second power deliver network structure 112 may be formed simultaneously in one manufacturing process, and may be formed of the same material. In addition, depending on the actual situation, the first power deliver network structure 110 and the second power deliver network structure 112 may have the same or similar structure, or may have different structures.

In this embodiment, both the first power deliver network structure 110 and the second power deliver network structure 112 are located in the peripheral region 100b, but the disclosure is not limited thereto. In other embodiments, the first power deliver network structure 110 and/or the second power deliver network structure 112 may be located in the element region 100a.

Figure 2A:
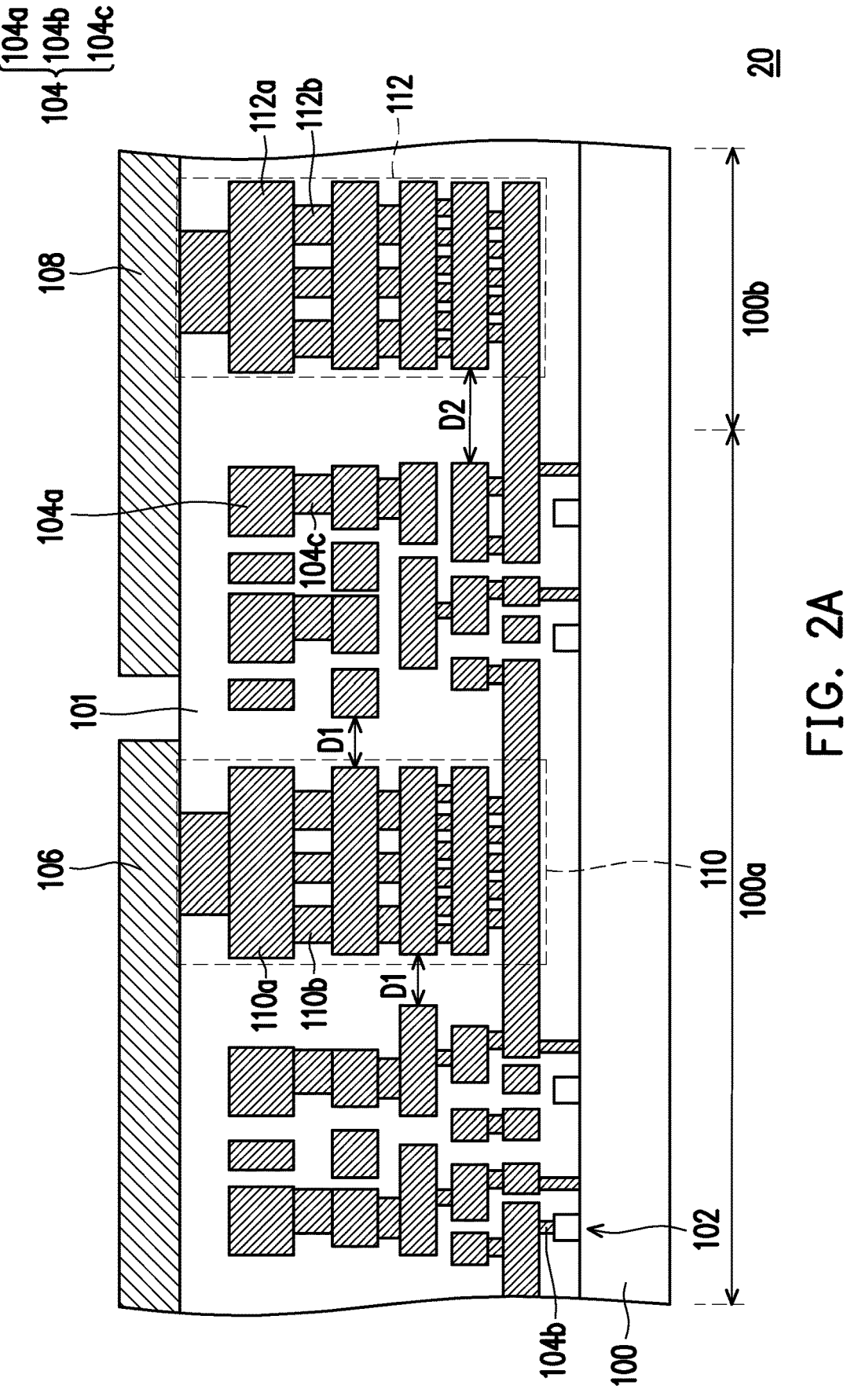
FIG. 2A is a cross-sectional schematic diagram of a semiconductor structure of a second embodiment of the disclosure.
Figure 2B:
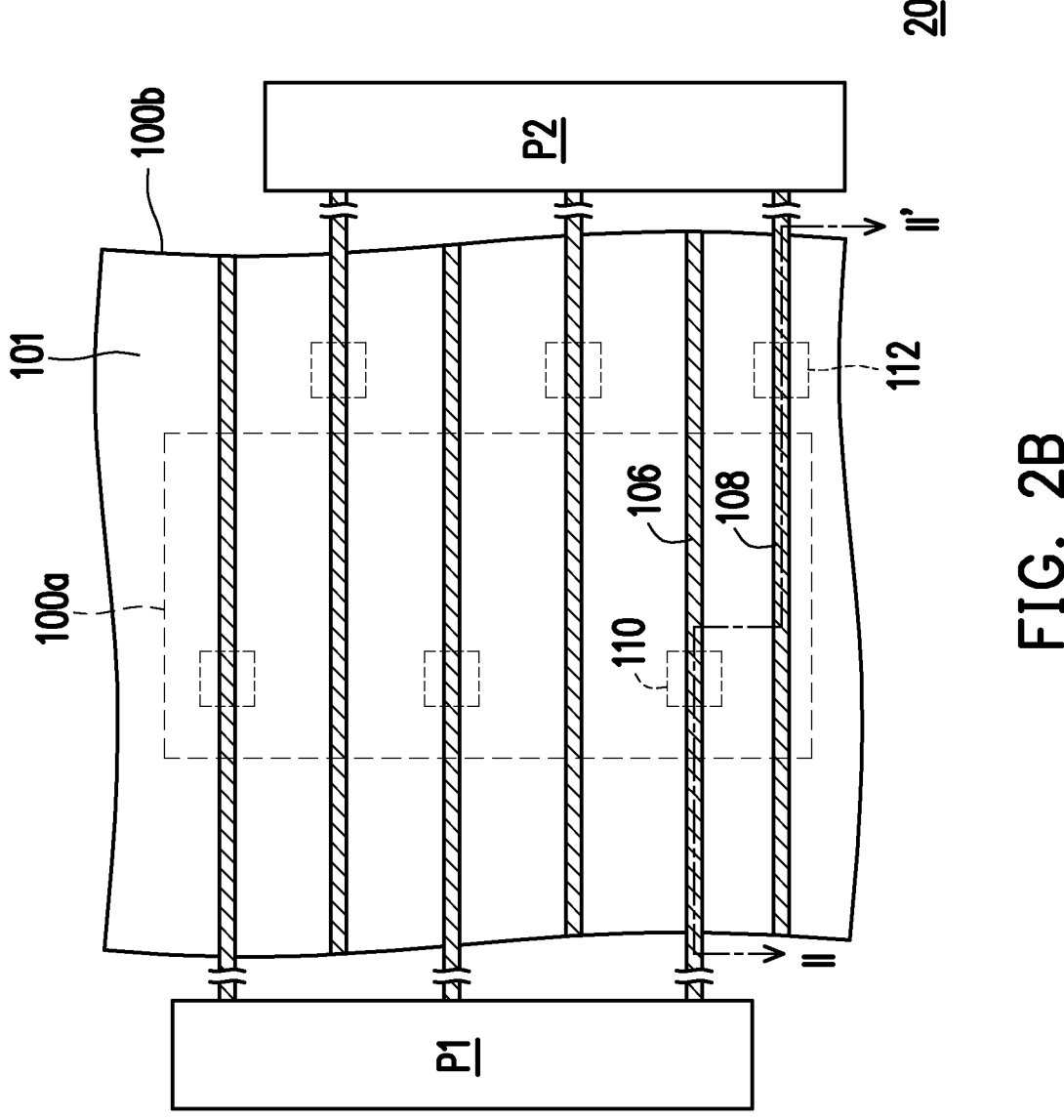

FIG. 2A is a cross-sectional schematic diagram of a semiconductor structure of a second embodiment of the disclosure. FIG. 2B is a top schematic diagram of the semiconductor structure of the second embodiment, in which FIG. 2A is drawn along section line II-II' in FIG. 2B. In this embodiment, the same elements as those of the first embodiment are denoted by the same reference symbols, and their description are not repeated herein.

Referring to FIG. 2A and FIG. 2B at the same time, in the semiconductor structure 20 of this embodiment, the first power deliver network structure 110 is located in the element region 100a and is disposed in the interconnect structure 104, and the second power deliver network structure 112 is located in the peripheral region 100b. The lowest first power deliver circuit layer 110a of the first power deliver network structure 110 is connected to the lowest circuit layer 104a of the interconnect structure 104, while the rest of the first power deliver circuit layers 110a are spaced apart from the interconnect structure 104 by a first distance D1.

In this embodiment, since the first power deliver network structure 110 is disposed in the element region 100a, the layout area of the semiconductor structure may be further reduced. In addition, in an embodiment, similar to the embodiment, the second power deliver network structure 112 may be located in the element region 100a and disposed in the interconnect structure 104, while the first power deliver network structure 110 may be located in the peripheral region 100b.

Alternatively, in another embodiment, both the first power deliver network structure 110 and the second power deliver network structure 112 may be located in the element region 100a and disposed in the interconnect structure 104.

Figure 3A:
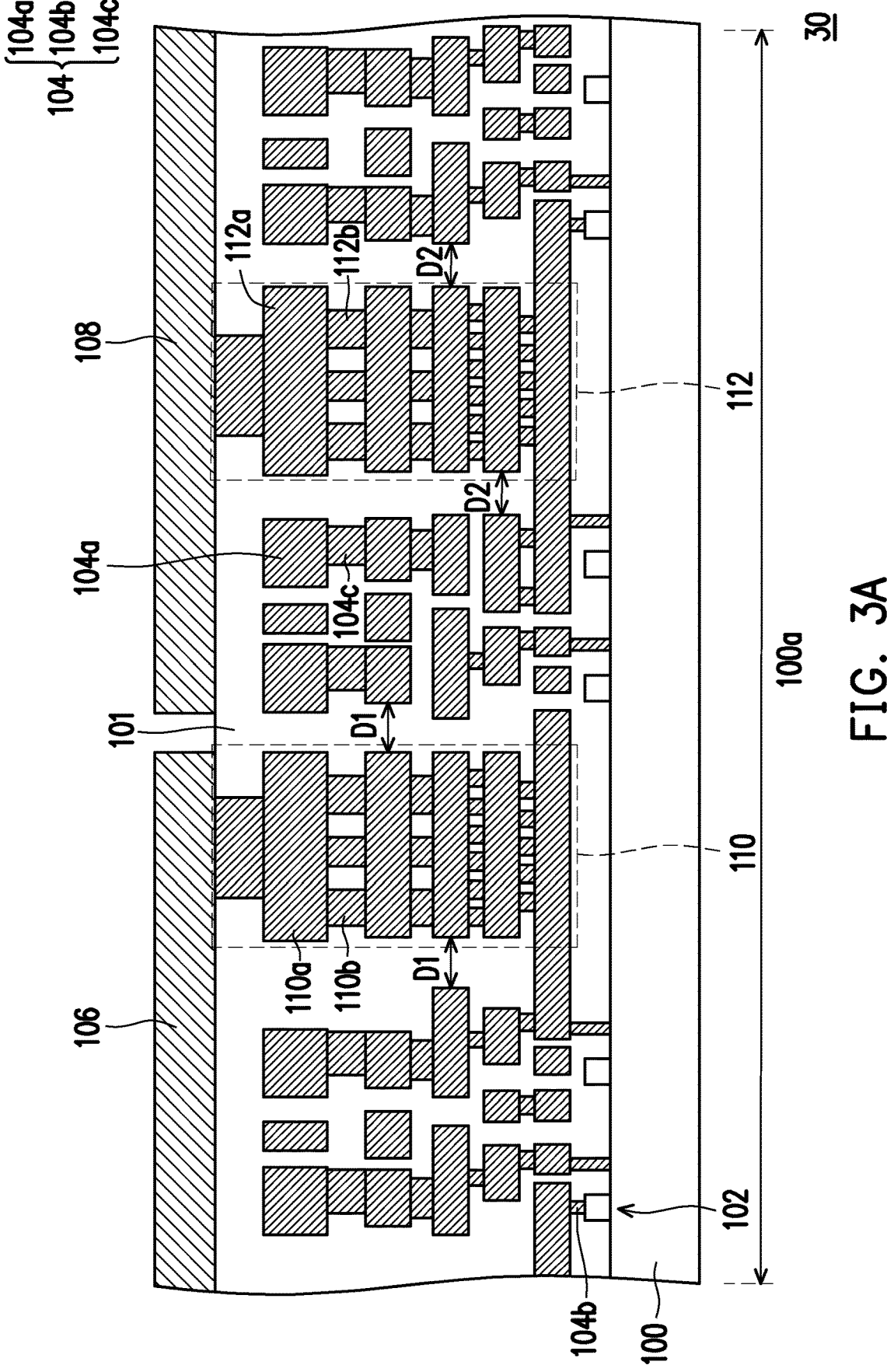
FIG. 3A is a cross-sectional schematic diagram of a semiconductor structure of a third embodiment of the disclosure.
Figure 3B:
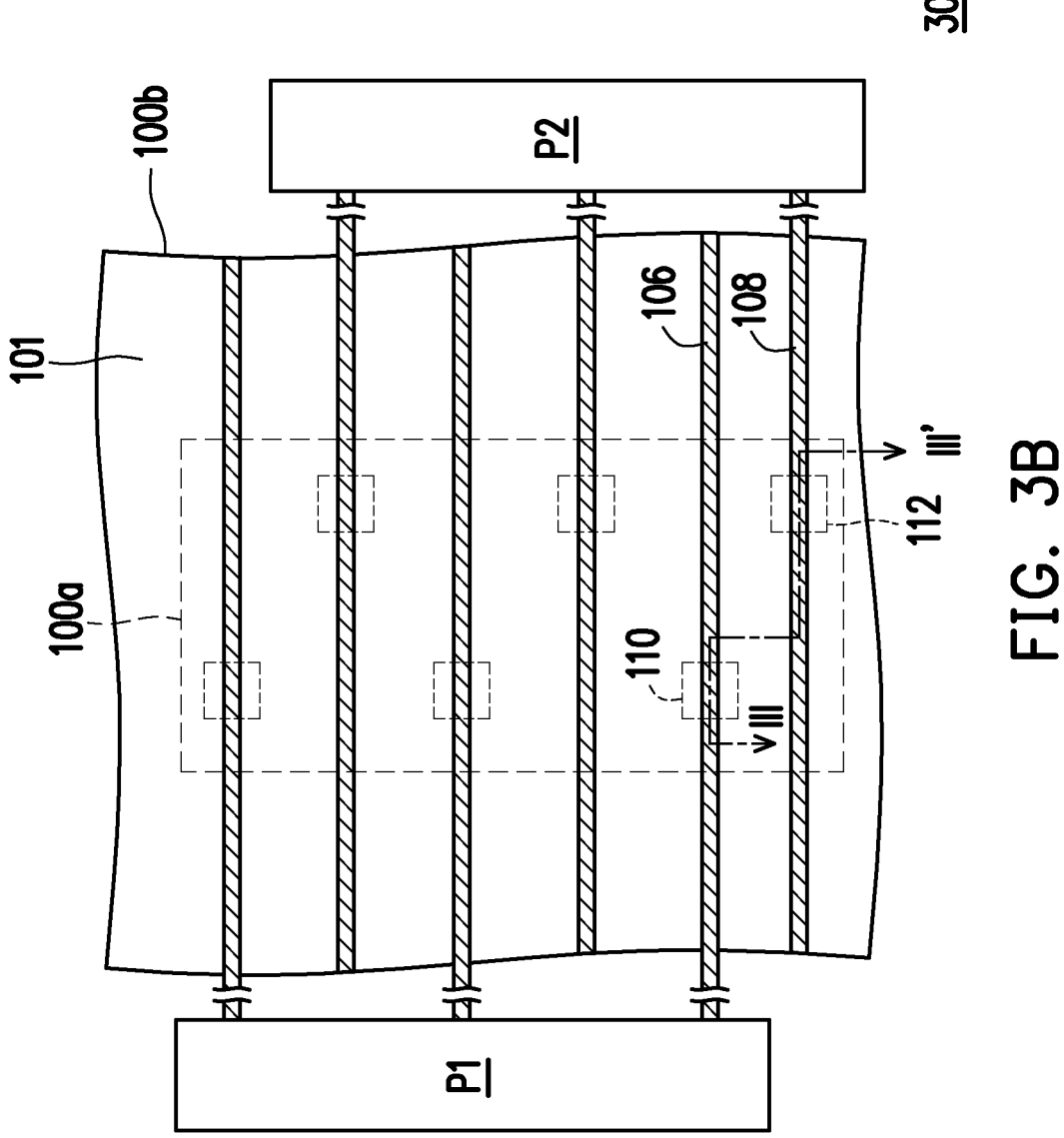

FIG. 3A is a cross-sectional schematic diagram of a semiconductor structure of a third embodiment of the disclosure. FIG. 3B is a top schematic diagram of the semiconductor structure of the third embodiment, in which FIG. 3A is drawn along section line III-III' in FIG. 3B. In this embodiment, the same elements as those of the first embodiment are denoted by the same reference symbols, and their description are not repeated herein.

Referring to FIG. 3A and FIG. 3B at the same time, in the semiconductor structure 30 of this embodiment, both the first power deliver network structure 110 and the second power deliver network structure 112 are located in the element region 100a, and both are disposed in the interconnect structure 104. The lowest first power deliver circuit layer 110a and the lowest second power deliver circuit layer 112a are respectively connected to the lowest circuit layer 104a of the interconnect structure 104. In addition, the rest of the first power deliver circuit layers 110a are spaced apart from the interconnect structure 104 by a first distance D1, and the rest of the second power deliver circuit layers 112a are spaced apart from the interconnect structure 104 by a second distance D2.

In each of the above embodiments, the lowest first power deliver circuit layer 110a of the first power deliver network structure 110 and the lowest second power deliver circuit layer 112a of the second power deliver network structure 112 are respectively connected to the lowest circuit layer 104a of the interconnect structure 104, and the rest of the first power deliver circuit layers 110a of the first power deliver network structure 110 and the rest of the second power deliver circuit layers 112a of the second power deliver network structure 112 are spaced apart from the interconnect structure 104. In other embodiments, the dummy structure may be disposed between the power deliver network structure and the interconnect structure 104, and the dummy structure is electrically separated from the power deliver network structure and the interconnect structure 104.

Figure 4:
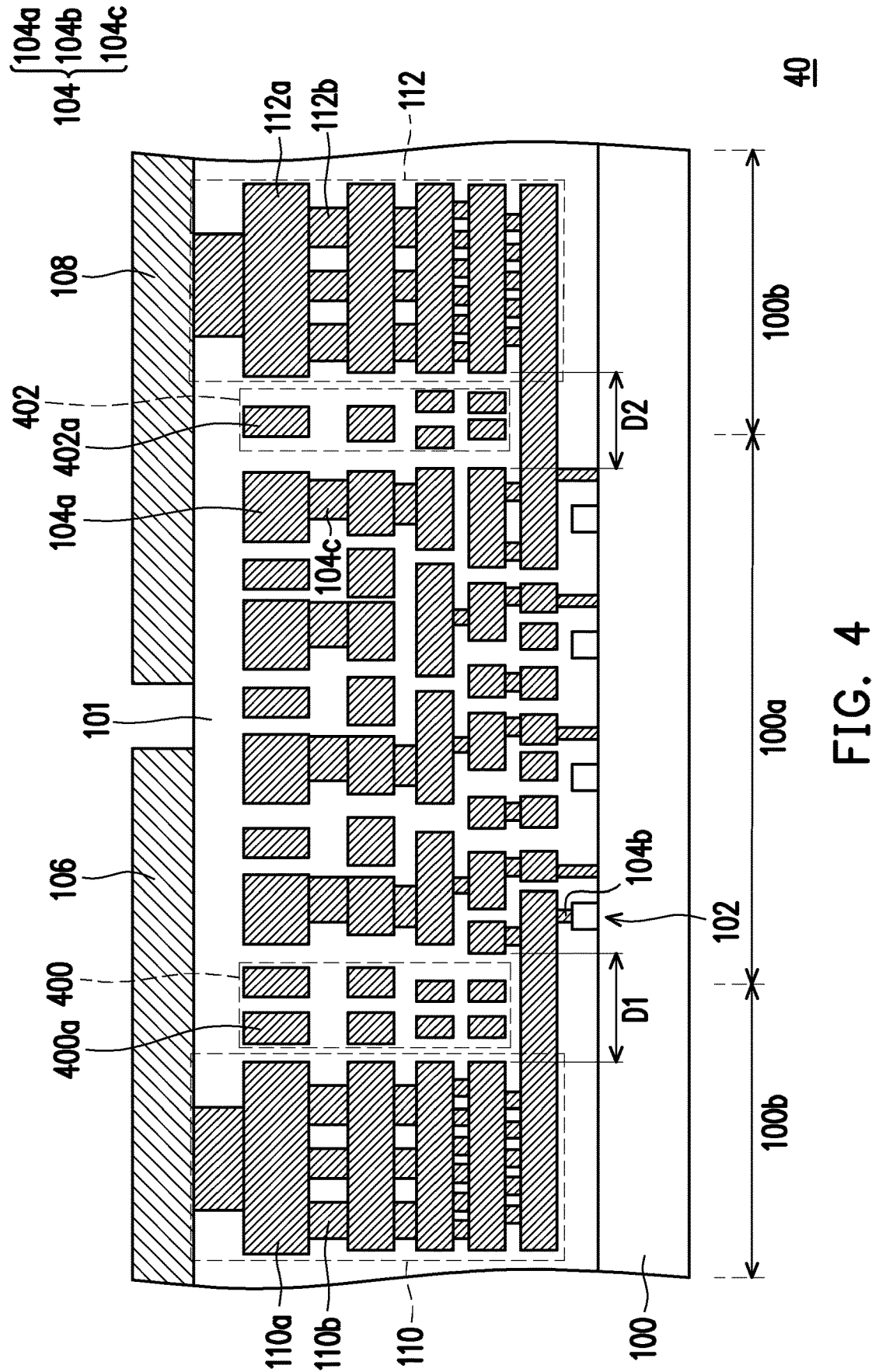
FIG. 4 is a cross-sectional schematic diagram of a semiconductor structure of a fourth embodiment of the disclosure.

FIG. 4 is a cross-sectional schematic diagram of a semiconductor structure of a fourth embodiment of the disclosure. In this embodiment, the same elements as those of the first embodiment are denoted by the same reference symbols, and their description are not repeated herein.

Referring to FIG. 4, in the semiconductor structure 40, the first dummy structure 400 may be disposed between the first power deliver network structure 110 and the interconnect structure 104, and the first dummy structure 400 is electrically separated from the first power deliver network structure 110 and the interconnect structure 104. In addition, the second dummy structure 402 may be disposed between the second power deliver network structure 112 and the interconnect structure 104, and the second dummy structure 402 is electrically separated from the second power deliver network structure 112 and the interconnect structure 104.

In detail, the first dummy structure 400 includes multiple first dummy circuit layers 400a. In this embodiment, each of the first dummy circuit layers 400a is located at the same horizontal height as the corresponding first power deliver circuit layer 110a. That is to say, the first dummy structure 400 and the first power deliver network structure 110 may be formed simultaneously in one manufacturing process. Therefore, the first dummy circuit layer 400a may be located at the same horizontal height as the corresponding first power deliver circuit layer 110a, and may be formed of the same material.

In addition, the second dummy structure 402 includes multiple second dummy circuit layers 402a. In this embodiment, each of the second dummy circuit layers 402a is located at the same horizontal height as the corresponding second power deliver circuit layer 112a. That is to say, the second dummy structure 402 and the second power deliver network structure 112 may be formed simultaneously in one manufacturing process. Therefore, the second dummy circuit layer 402a may be located at the same horizontal height as the corresponding second power deliver circuit layer 112a, and may be formed of the same material.

In other words, in this embodiment, the interconnect structure 104, the first power deliver network structure 110, the second power deliver network structure 112, the first dummy structure 400, and the second dummy structure 402 may be formed simultaneously in one manufacturing process, and may be formed of the same material. In addition, depending on the actual situation, the first dummy structure 400 and the second dummy structure 402 may have the same or similar structure, or may have different structures.

When the distance between the first power deliver network structure 110 and the interconnect structure 104 is large, disposing the first dummy structure 400 may be configured to stabilize the semiconductor structure. In addition, when the distance between the second power deliver network structure 112 and the interconnect structure 104 is large, disposing the second dummy structure 402 may be configured to stabilize the semiconductor structure. The first dummy structure 400 and the second dummy structure 402 do not have the function of transmitting power and transmitting electrical signals.

In this embodiment, the first dummy structure 400 is disposed between the first power deliver network structure 110 and the interconnect structure 104, and the second dummy structure 402 is disposed between the second power deliver network structure 112 and the interconnect structure 104, but the disclosure is not limited thereto. In other embodiments, only the first dummy structure 400 or the second dummy structure 402 may be disposed depending on the actual situation.

Figure 5:
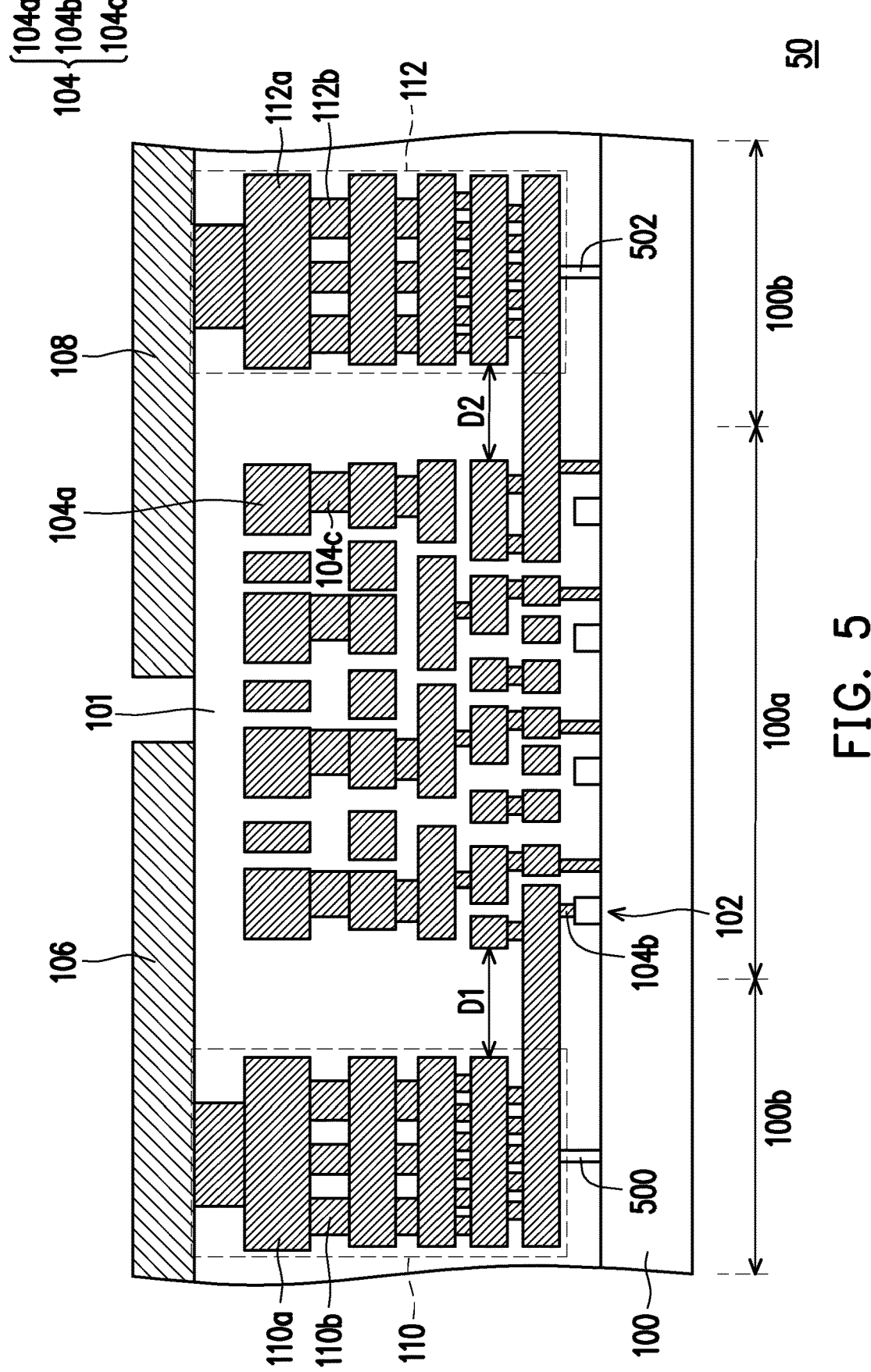
FIG. 5 is a cross-sectional schematic diagram of a semiconductor structure of a fifth embodiment of the disclosure.

FIG. 5 is a cross-sectional schematic diagram of a semiconductor structure of a fifth embodiment of the disclosure. In this embodiment, the same elements as those of the first embodiment are denoted by the same reference symbols, and their description are not repeated herein.

Referring to FIG. 5, in the semiconductor structure 50, the first support structure 500 is disposed between the first power deliver network structure 110 and the substrate 100, and the second support structure 502 is disposed between the second power deliver network structure 112 and the substrate 100. In detail, the first support structure 500 is located in the peripheral region 100b, and is connected to the lowest first power deliver circuit layer 110a of the first power deliver network structure 110 and the substrate 100. In addition, the second support structure 502 is located in the peripheral region 100b, and is connected to the lowest second power deliver circuit layer 112a of the second power deliver network structure 112 and the substrate 100.

The first support structure 500 and the second support structure 502 are configured to provide supporting force for the first power deliver network structure 110 and the second power deliver network structure 112 to avoid deformation of the semiconductor structure 50, such as dishing. The first support structure 500 and the second support structure 502 do not have the function of transmitting power and transmitting electrical signals.

In this embodiment, a first support structure 500 is disposed between the first power deliver network structure 110 and the substrate 100, and a second support structure 502 is disposed between the second power deliver network structure 112 and the substrate 100. However, the disclosure does not limit the number of the first support structures 500 and the number of the second support structures 502.

In each of the above embodiments, a first power deliver network structure 110 is disposed between each of the first power deliver lines 106 and the substrate 100, and a second power deliver network structure 112 is disposed between each of the second power deliver lines 108 and the substrate 100, but the disclosure is not limited thereto. In other embodiments, depending on actual requirements, more first power deliver network structures 110 may be disposed between each of the first power deliver lines 106 and the substrate 100, and more second power deliver network structures 112 may be disposed between each of the second power deliver lines 108 and the substrate 100.

In addition, the distance between adjacent power deliver network structures may be between 10 μm and 1000 μm. In detail, depending on the actual number of power deliver network structures and the layout design, the distance between adjacent first power deliver network structures 110 and second power deliver network structures 112 may be between 10 μm and 1000 μm. In addition, the distance between the first power deliver network structure 110 in a first power deliver line 106 and the first power deliver network structure 110 in another first power deliver line 106 may be between 10 μm and 1000 μm, and the distance between the second power deliver network structure 112 in one second power deliver line 108 and the second power deliver network structure 112 in another second power deliver line 108 may be between 10 μm and 1000 μm. When the distance is less than 10 μm, the winding design affects other circuit layouts. When the distance is greater than 1000 μm, the layout design of the circuit deliver network is affected, and the effect of reducing power loss (IR drop) cannot be achieved.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A semiconductor structure, comprising:
   a substrate, comprising an element region and a peripheral region surrounding the element region;
   a semiconductor element, disposed on the substrate in the element region;
   an interconnect structure, disposed in the element region, located above the semiconductor element, and electrically connected to the semiconductor element;
   a first power deliver line, disposed above the interconnect structure and electrically connected to a first power source;
   a second power deliver line, disposed above the interconnect structure and electrically connected to a second power source;
   a first power deliver network structure, disposed between the substrate in the peripheral region and the first power deliver line, and connected to the first power deliver line and a lowest circuit layer of the interconnect structure; and
   a second power deliver network structure, disposed between the substrate in the peripheral region and the second power deliver line, and is connected to the second power deliver line and the lowest circuit layer of the interconnect structure, wherein the first power deliver network structure comprises:

a plurality of first power deliver circuit layers; and a plurality of first power deliver vias, connected to two adjacent first power deliver circuit layers among the first power deliver circuit layers, wherein a lowest first power deliver circuit layer of the first power deliver circuit layers is connected to the lowest circuit layer of the interconnect structure, edges of a rest of the first power deliver circuit layers are spaced apart from the interconnect structure by a first distance, and the first distance is between 1 μm and 10 μm, wherein the second power deliver network structure comprises:

a plurality of second power deliver circuit layers; and a plurality of second power deliver vias, connected to two adjacent power deliver circuit layers among the second power deliver circuit layers, wherein a lowest second power deliver circuit layer of the second power deliver circuit layers is connected to the lowest circuit layer of the interconnect structure, edges of a rest of the second power deliver circuit layers are spaced apart from the interconnect structure by a second distance, and the second distance is between 1 μm and 10 μm.

2. The semiconductor structure according to claim 1, further comprising a first dummy structure, disposed between the first power deliver network structure and the interconnect structure, and electrically separated from the first power deliver network structure and the interconnect structure.

3. The semiconductor structure according to claim 2, wherein the first dummy structure comprises a plurality of first dummy circuit layers.

4. The semiconductor structure according to claim 3, wherein each of the first dummy circuit layers is located at a same horizontal height as the corresponding first power deliver circuit layer.

5. The semiconductor structure according to claim 2, wherein a material of the first dummy structure is the same as a material of the first power deliver network structure.

6. The semiconductor structure according to claim 1, wherein the first power deliver network structure is located in the peripheral region.

7. The semiconductor structure according to claim 1, wherein the first power deliver network structure is located in the interconnect structure.

8. The semiconductor structure according to claim 1, further comprising a first support structure, disposed between the first power deliver network structure and the substrate.

9. The semiconductor structure according to claim 1, further comprising a second dummy structure, disposed between the second power deliver network structure and the interconnect structure, and electrically separated from the second power deliver network structure and the interconnect structure.

10. The semiconductor structure according to claim 9, wherein the second dummy structure comprises a plurality of second dummy circuit layers.

11. The semiconductor structure according to claim 10, wherein each of the second dummy circuit layers is located at a same horizontal height as the corresponding second power deliver circuit layer.

12. The semiconductor structure according to claim 9, wherein a material of the second dummy structure is the same as a material of the second power deliver network structure.

13. The semiconductor structure according to claim 1, wherein the second power deliver network structure is located in the peripheral region.

14. The semiconductor structure according to claim 1, wherein the second power deliver network structure is located in the interconnect structure.

15. The semiconductor structure according to claim 1, further comprising a second support structure, disposed between the second power deliver network structure and the substrate.

16. The semiconductor structure according to claim 1, wherein a distance between the first power deliver network structure and the second power deliver network structure is between 10 μm and 1000 μm.

* * * * *